United States Patent
Haba et al.

(10) Patent No.: US 10,750,614 B2
(45) Date of Patent: Aug. 18, 2020

(54) DEFORMABLE ELECTRICAL CONTACTS WITH CONFORMABLE TARGET PADS

(71) Applicant: Invensas Corporation, San Jose, CA (US)

(72) Inventors: Belgacem Haba, Saratoga, CA (US); Gabriel Z. Guevara, Gilroy, CA (US)

(73) Assignee: Invensas Corporation, San Jose, CA (US)

( * ) Notice: Subject to any disclaimer, the term of this patent is extended or adjusted under 35 U.S.C. 154(b) by 53 days.

(21) Appl. No.: 15/980,894

(22) Filed: May 16, 2018

(65) Prior Publication Data
US 2018/0359855 A1 Dec. 13, 2018

Related U.S. Application Data

(60) Provisional application No. 62/518,406, filed on Jun. 12, 2017.

(51) Int. Cl.
*H05K 1/11* (2006.01)
*H05K 3/30* (2006.01)
(Continued)

(52) U.S. Cl.
CPC ......... *H05K 1/111* (2013.01); *H01R 13/2407* (2013.01); *H01R 43/20* (2013.01); (Continued)

(58) Field of Classification Search
None
See application file for complete search history.

(56) References Cited

U.S. PATENT DOCUMENTS 4,548,451 A * 10/1985 Benarr ................ H01R 12/714
29/848
4,793,814 A * 12/1988 Zifcak ................ H01R 13/2435
439/66
(Continued)

FOREIGN PATENT DOCUMENTS

KR 10-2011-0123456 A 11/2011

OTHER PUBLICATIONS

International Search Report and Written Opinion for PCT/US2018/033833, dated Sep. 19, 2018, 18 pages.

*Primary Examiner* — Dimary S Lopez Cruz (57) ABSTRACT

Deformable electrical contacts with conformable target pads for microelectronic assemblies and other applications are provided. A plurality of deformable electrical contacts on a first substrate may be joined to a plurality of conformable pads on a second substrate during die level or wafer level assembly of microelectronics, for example. Each deformable contact deforms to a degree that is related to the amount of joining pressure between the first substrate and the second substrate. The deformation process also wipes each respective conformable pad with the deformable electrical contact to create a fresh metal-to-metal contact for good conduction. Each conformable pad collapses as pressured by a compressible material to assume the approximate deformed shape of the electrical contact, providing a large conduction surface area, while also compensating for horizontal misalignment. Temperature can be raised to melt a dielectric, which encapsulates the electrical connections, equalizes gaps and variations between the two substrates, and permanently secures the two substrates together.

18 Claims, 10 Drawing Sheets

(51) Int. Cl.
*H01R 13/24* (2006.01)
*H01R 43/20* (2006.01)
*H05K 3/40* (2006.01)
H05K 3/34 (2006.01)
H05K 3/36 (2006.01)

(52) U.S. Cl.
CPC ............. *H05K 1/113* (2013.01); *H05K 3/303* (2013.01); *H05K 3/4007* (2013.01); *H05K 3/3436* (2013.01); *H05K 3/368* (2013.01); *H05K 2201/0311* (2013.01); *H05K 2203/0257* (2013.01)

(56) References Cited

U.S. PATENT DOCUMENTS

| | | | |
|---|---|---|---|
| 4,813,129 A * | 3/1989 | Karnezos | H01R 13/2464 257/E23.021 |
| 5,097,101 A * | 3/1992 | Trobough | H05K 3/4007 174/254 |
| 5,129,142 A | 7/1992 | Bindra et al. | |
| 5,228,861 A * | 7/1993 | Grabbe | H01R 12/52 439/591 |
| 5,414,298 A | 5/1995 | Grube | |
| 5,525,065 A * | 6/1996 | Sobhani | H01R 12/52 439/67 |
| 5,632,631 A * | 5/1997 | Fjelstad | G01R 1/0466 257/E23.067 |
| 5,946,553 A * | 8/1999 | Wood | G01R 1/0466 257/E21.509 |
| 6,042,391 A * | 3/2000 | Bodo | H01L 23/49811 257/686 |
| 6,114,221 A * | 9/2000 | Tonti | H01L 21/76898 257/686 |
| 6,335,492 B1 * | 1/2002 | Terasaka | H01L 23/49811 174/261 |
| 6,398,561 B1 * | 6/2002 | Okuno | G01R 1/06755 29/831 |
| 7,435,108 B1 | 10/2008 | Eldridge | |
| 7,553,165 B2 * | 6/2009 | Mathieu | G01R 3/00 439/66 |
| 8,109,768 B2 * | 2/2012 | Nikaido | H01R 12/57 174/262 |
| 8,137,113 B2 * | 3/2012 | Ouchi | H05K 3/326 439/66 |
| 8,177,561 B2 * | 5/2012 | Ouchi | H01R 13/2485 174/260 |
| 2002/0142517 A1 * | 10/2002 | Maeda | H01L 24/81 438/108 |
| 2004/0045159 A1 | 3/2004 | DiStefano et al. | |
| 2016/0190102 A1 | 6/2016 | Kawashita et al. | |

* cited by examiner

DEFORMABLE ELECTRICAL CONTACTS WITH CONFORMABLE TARGET PADS

RELATED APPLICATIONS

This patent application claims the benefit of priority to U.S. Provisional Patent Application No. 62/518,406 to Haba et al, filed Jun. 17, 2017, and incorporated by reference herein, in its entirety.

BACKGROUND

Substrates or surfaces in 3D integrated circuit production or in electronic assembly in general may have arrays of electrical contacts, bonding pads, or grid arrays to be conductively joined to corresponding electrical contacts on a second substrate or surface. Uniformity in the contacts may not always be perfect. Conventionally, if a single electrical contact is too short or too tall, there is often no leeway in the joining of the two surfaces to allow the short contact to meet its target bonding pad, or to prevent a tall contact from preventing the bonding of nearby contacts. This is because conventional contacts are all assumed to be ideal, and dielectric layers present between surfaces to be joined are calculated to provide an unvarying stop in the joining of the two surfaces at a definite, single, fixed distance. This lack of compliance in conventional die or wafer level joining processes results in a certain percentage of the final product being unacceptable, as there may be some electrical contacts that did not connect during the joining.

SUMMARY

Deformable electrical contacts with conformable target pads for microelectronic assemblies and other applications are provided. A plurality of deformable electrical contacts on a first substrate may be joined to a plurality of conformable pads on a second substrate during die level or wafer level assembly of microelectronics, for example. Each deformable contact deforms as pressured by a compressible material to a degree that is related to the amount of joining pressure between the first substrate and the second substrate. The deformation process also wipes each respective conformable pad with the deformable electrical contact to create a fresh metal-to-metal contact for good conduction. Each conformable pad collapses to assume the approximate deformed shape of the electrical contact, providing a large conduction surface area, while also compensating for horizontal misalignment. Temperature can be raised to melt a dielectric, which encapsulates the electrical connections, equalizes gaps and variations between the two substrates, and permanently secures the two substrates together.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes deformable electrical contacts with conformable target pads for microelectronic assemblies and other applications. The described electrical contacts and conformable target pads are not limited to microelectronics but can be used in larger scale electronic assemblies and for making electrical connections in general.

Example Systems

In an implementation, the apparatuses and methods described herein may be applied to joining together numerous types of substrates or surfaces that have electrical connections to be made across the two surfaces, during joining. In an implementation, each conductive electrical contact has a geometry that enables the electrical contact to deform in a certain manner under contact pressure against a target conductive pad, when making electrical connection between the two. The target conductive pad also deforms, at least in part, collapsing subsequently or simultaneously to conform to the deformation shape of the deformed electrical contact. This provides a large surface area for conduction across the electrical connection formed. The process of deforming the electrical contacts and conforming the target pads to the deformed shape of the contacts also includes a wiping feature. A sheering action between the electrical contacts and their corresponding target pads, during deformation and conformation, creates a fresh metal-to-metal interface between the two for a good thermocompression bond and metal-to-metal diffusion bonding.

A dielectric backing at least the deformable electrical contacts or the conformable pads can be softened or melted at raised temperature to encapsulate the electrical connections, to flow into spaces to equalize variations in the surfaces, and to secure the first surface to the second surface.

In an example scenario, the deformable electrical contacts may be electrically coupled to conductive vias running through a substrate. The deformable electrical contacts then make electrical contact with target electrical pads of a routing layer, for example, on a second substrate, during electronic or package assembly, thereby extending the conductive via, or coupling the conductive via with further electronics or routing lines.

The deformation-conformation action between each deformable electrical contact and a corresponding conductive target pad, provides several benefits. First, a shifting or sliding contact motion between an electrical contact and its target pad, as the connection is being made, provides a wiping or scraping action between wiping surfaces, metal contact points, or metal edges of a given deformable electrical contact, and the metal surface of the corresponding target pad. This wiping action clears away oxide layers and other patinas and impurities on the two mating surfaces to make a fresh and clean metal-to-metal electrical contact and initial metallic contact interface or thermocompression bond between the two metals. Second, a relatively large surface area of the target pad, newly wiped, makes electrical contact with a relatively large surface area of the deformed electrical contact, providing a large conductive path through the relatively large surface area of the metal-to-metal interface shared by the two surfaces, not just through a few points of contact, as occurs between a conventional electrical contact and a conventional nonconforming and non-yielding flat target pad. Third, this deformational-conformational electrical mating technique provides some tolerance and flexibility not only for variations in vertical distance between electrical contacts and their target pads, but also for horizontal misalignment between numerous electrical contacts and their corresponding target pads on a second substrate. A deformable electrical contact may "miss" perfect horizontal alignment with its target pad, and the conformation of the target pad to the deformed electrical contact can compensate for the misalignment, providing a solid connection with ample conductive capacity in spite of the initial misalignment.

The construction materials, including metals selected for the contacts and pads, and dielectrics or other underfill materials selected for the backing layers behind the contacts and pads can play a role in effecting the wiping action and the deformation-conformation of the contacts and pads. At least one underfill material between the first substrate and the second substrate can deform each contact against each corresponding pad, and also determine the proximity of the first substrate to the second substrate when the two substrates are permanently secured together.

A layer of underfill material can be a first solid underfill material and a second flowable underfill material, a flowable dielectric, a solid dielectric, both a solid dielectric and a flowable dielectric, a mixture of solid and flowable polymers, or a thermoplastic polyimide, for example.

At least one underfill material can be disposed on the first surface, on the second surface, or on both the first surface and the second surface before the first substrate is joined to the second substrate, and at least one underfill material may cool, fuse, or harden to permanently join the first substrate to the second substrate.

A first layer of an underfill may back the plurality of contacts and a second layer of an underfill may back the plurality of pads. In an implementation, the first layer of underfill and the second layer of underfill have respective hardnesses suitable for deforming the contacts into the pads, and then conforming the pads into the deformed shape of the contacts at a joining temperature for the contacts and pads.

The deformation and conformation of the contacts and pads may occur simultaneously, as the contacts and pads also wipe each other of their oxide layers and expose fresh metal surfaces to couple with and bond. In an implementation, the first layer of underfill and the second layer of underfill have a softening temperature or a fusion temperature higher than the joining temperature of the contacts and pads, so that the softened material can encapsulate the coupled contacts and pads, and then glue or secure the first layer of underfill and the second layer of underfill to each other and permanently secure the first substrate to the second substrate.

The first material for the first layer of underfill and/or the second material (or same material) for the second layer of underfill may have a flowability at the softening temperature for filling holes, gaps, and spaces in the first layer of underfill and the second layer of underfill and around the coupled contacts and pads to absorb or compensate for z-thickness variations of the first and second substrates and the first and second underfill layers.

Figure 1:
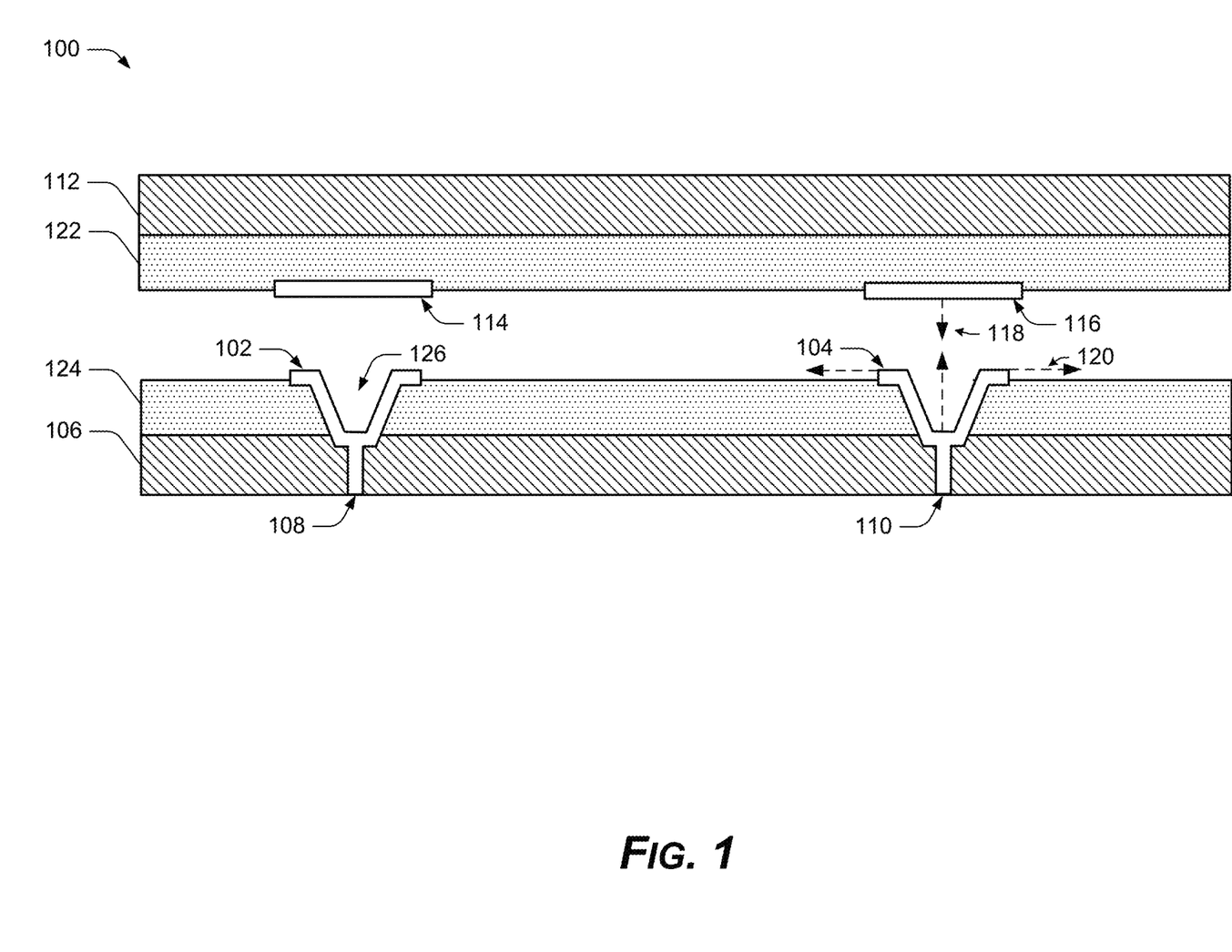
FIG. 1 is a diagram of an example system in which deformable contacts on a first substrate are joined to conformable target pads on a second substrate.

FIG. 1 shows an example system 100. Example deformable conductive contacts 102 & 104 are disposed on a first substrate 106 and conductively connected to respective electrical conductors 108 & 110 in the first substrate 106, such as parts of an integrated circuit, or through-silicon-vias. In an implementation, the example first substrate 106, which is to be joined to a second substrate 112, has a plurality of the deformable conductive contacts 102 & 104 (hereinafter, "deformable contacts" or "deformable electrical contacts"), one for each electrical connection to be made across the interface between the two substrates 106 & 112. Deformable, as used herein, means that the electrical contact 102 changes shape to at least partially comply with its electrical target 114 when pressed against that electrical target 114. In an implementation, each deformable contact 102 & 104 expands open 120 against its respective target conductive pad 114 & 116 as the deformable contacts 102 & 104 compress 118 against the opposing target pads 114 & 116. Depending on style, the deformable contact 102 may expand 120 to conductively couple with the target pad 114 by curving, bending, warping, bulging, or hinging at an expanse, a bend, or a curve of its shape. Likewise, a deformable contact 102 may be made with leaf-like arms thin enough to bend along an expanse of their length to comply with the target pad 114 when forced up against the target pad 114 by the joining forces applied.

An example system 100, therefore, may have a plurality of deformable contacts 102 & 104 on a first substrate 106, a plurality of conductive pads 114 & 116 on a second substrate 112, each deformable contact 102 & 104 capable of conductively coupling with a corresponding conductive pad 114 & 116 when the first substrate 106 is joined to the second substrate 112. Each deformable contact 102 & 104 is configured to comply, such as spread open 120, in relation to a degree of compression 118 against each corresponding conductive pad 114 & 116. At least one underfill material 122 and/or 124 is disposed between the first substrate 106 and the second substrate 112 to actuate each deformable contact 102 & 104 against each corresponding conductive pad 114 & 116 and to determine a closest proximity 124 of the first substrate 106 to the second substrate 112.

Underfill materials 122 & 124, such as compressible material, a dielectric, or a combination of materials, underlies or underflows the plurality of deformable contacts 102 & 104 and applies pressure to the contacts 102 & 104 to push the contacts 102 & 104 against target pads 114 & 116 on the opposing surface of the second substrate 112. The underfill material 124 around the deformable contacts 102 & 104 also determines the relative stiffness or resilience of the contacts 102 & 104 against their corresponding target pads 114 & 116 on the opposing surface of the second substrate 112.

The "interior" of a given deformable electrical contact 102 may be devoid of the underfill material 124, thereby presenting a hole 126 or gap in the underfill layer 124 that is presented for joining against the other substrate 112.

Each deformable contact 102 & 104 independently deforms to comply with its respective target conductive pad 114 & 116, individually complying, for example by spreading open 120, to a degree dictated by the individual distance between contact 102 and respective target pad 114, as needed to make a favorable conductive coupling. Numerous deformable contacts 102 & 104, as a group or plurality, provide a compliant system 100 for making successful conductive couplings across numerous electrical contacts 102 & 104, including contacts that may not be perfect, and contacts that may not be at an expected height.

Figure 2:
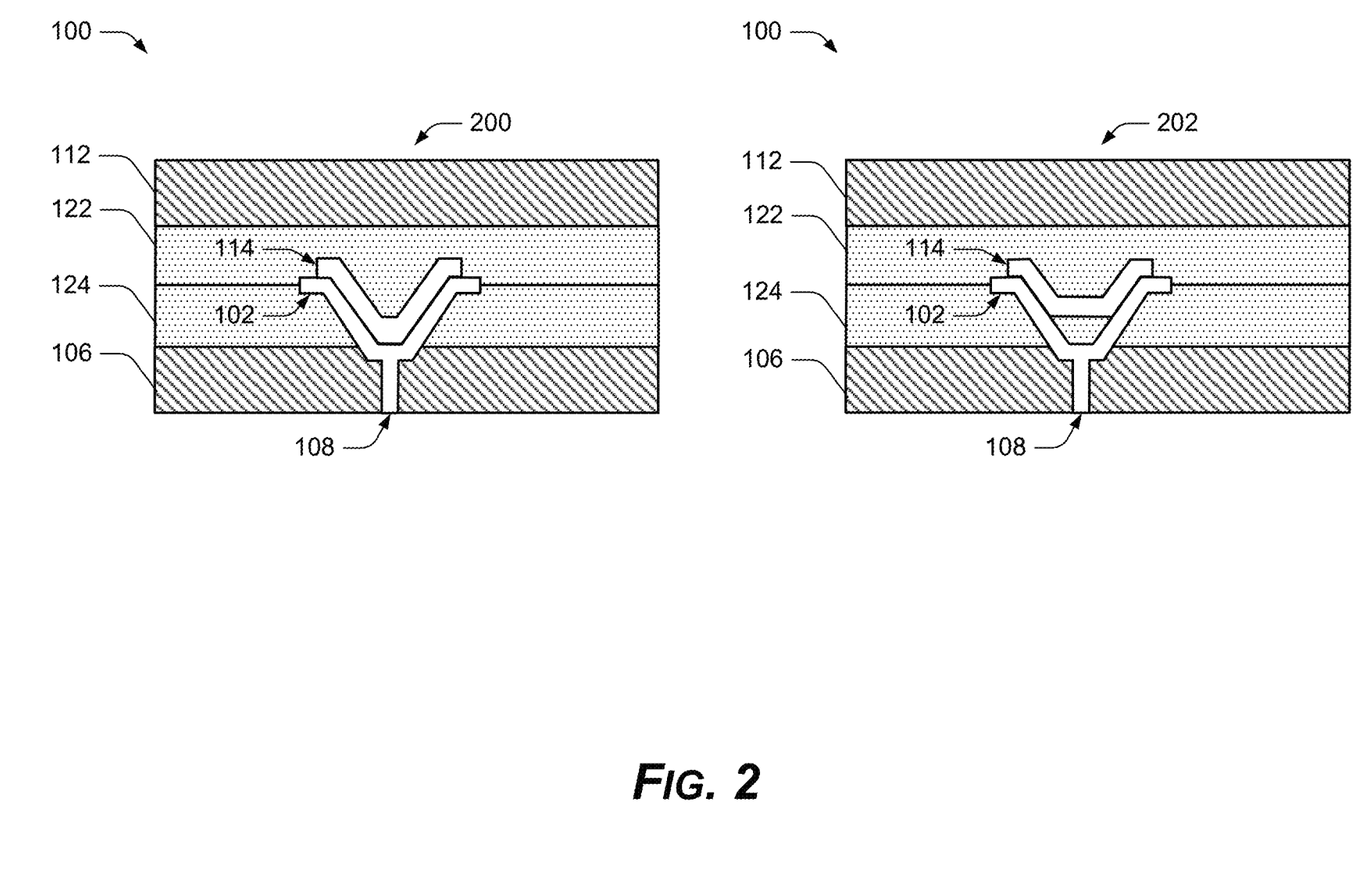
FIG. 2 is a diagram of an example joined state of the example system of FIG. 1.

FIG. 2 shows two example joined states of the substrates 106 & 112 in the example system 100. In an implementation, the underfill materials 122 & 124 can determine the greatest extent of deformation, shape-change, or compression 118 of each contact 102, and finally, determine a permanent distance between the two joined surfaces 106 & 112, because the underfill materials 122 & 124 ultimately provide an incompressible stop or a not-further-compressible stop to the joining action. The underfill materials 122 & 124 may also cool or harden to hold, adhere, or cement the joined surfaces 106 & 112 together.

The conformable target pads 114 may fully conform 200 or partially conform 202 to their corresponding deformed electrical contact 102. In FIG. 2, the underfill layers 122 & 124 have been joined together, thereby applying pressure to the deformable electrical contact 102 and the conformable target pad 114. The "interior" of a given deformable electrical contact 102 may be devoid of the underfill material 124, thereby presenting a hole 126 or gap in the underfill layer 124 that is presented for joining against the other substrate 112. The other layer of underfill material 122 backing the conformable target pads 114, which may be a compressible material, presses or collapses the compressible pads 114 into the deformed electrical contacts 102, also filling the holes 126 (in FIG. 1). In an implementation, an increase in pressure, or temperature, or both, softens or melts one or more of the underfill layers 122 & 124 to encapsulate the electrical connection now formed by the mated electrical contact 102 and its target pad 114, but also flows the underfill material(s) 122 to fill spaces, holes 126, gaps, and bubbles in the matrix thus formed. The underfills 122 & 124 may then be cooled to permanently secure the two substrates 106 & 112 together.

Figure 3:
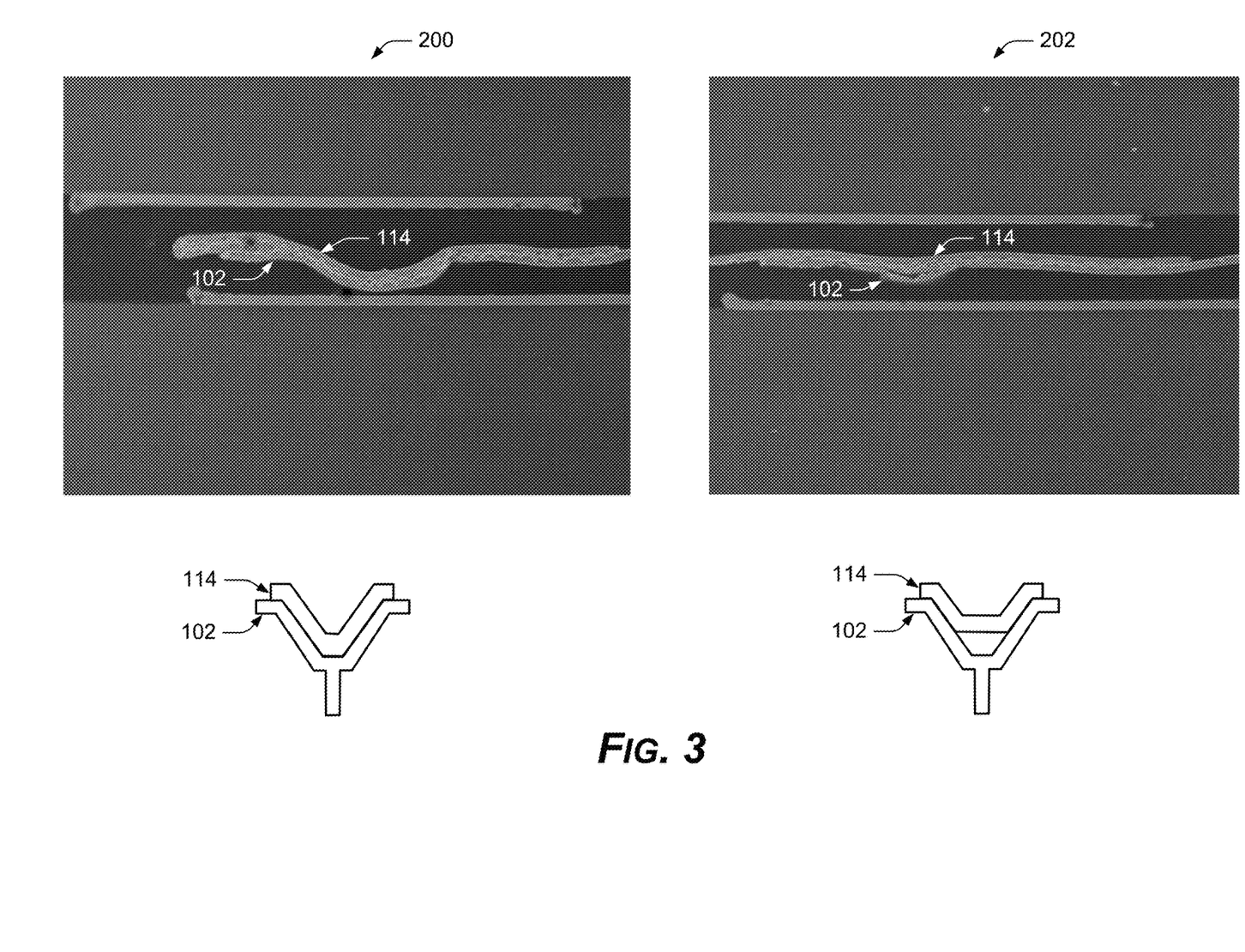
FIG. 3 shows micrographs of full conformation and partial conformation of a conformable target pad to a corresponding deformable electrical contact.

FIG. 3 shows micrographs of an example deformable electrical contact 102 and a corresponding conformable target pad 114. The micrographs show a full conformation 200 of the conformable target pad 114 against the deformable electrical contact 102, and a partial conformation 202 of the conformable target pad 114 against the deformable electrical contact 102.

Construction materials are selected to provide the deformation-conformation effect between electrical contact and target conductive pad, across tens, hundreds, or thousands of the electrical contacts and corresponding target pads to be electrically mated when joining two substrates for microelectronic assembly or package assembly. In an implementation, an array of the electrical contacts are backed by a first material, such as a first dielectric, and the corresponding array of conformable target electrical pads are backed by a second material, such as a second dielectric. In an implementation, the first material and the second material may be the same material.

In an implementation, the electrical contacts and the corresponding target pads are brought into relatively low-pressure contact with each other at a relatively low temperature, causing the sliding, scraping, and/or wiping action between the two that provides a positive metal-to-metal electrical contact and beginnings of a physical metallic bond or thermocompression bond between the two. Continuing pressure and/or a raised temperature causes the two backing materials to soften or begin to melt, after the electrical contacts and the corresponding target pads are fully mated, thereby excluding the softening backing materials from seeping in or intervening with the metal-to-metal electrical contact already made.

The softening or melting materials can flow to fill holes and defects between the two substrates or among the electrical contacts and target pads. This flowing and filling mechanism of the backing materials into holes and spaces can be intentionally incorporated into package assembly by designing-in holes, gaps, or spaces to be filled by the melting layers during joining. The filling of holes, gaps, and spaces by the melting layers can equalize pressures across the mating substrates, can compensate for chance variability in the construction or materials, and/or can compensate for minor variation in the distances between electrical contacts and their corresponding target pads, across the broad surfaces of the substrates being joined.

One or more layers of materials backing the deformable electrical contacts may soften or melt at the same time and in the same manner as a one or more layers of materials backing the conformable target pads. Or, the two materials may soften or melt differentially, for example, in a selected sequence according to programmed parameters. For example, the material(s) backing the deformable electrical contacts may soften first, allowing the electrical contacts to deform or to begin deforming against the target pads. The material backing the target pads may remain relatively firm to provide a firm backing or relatively unyielding surface for the deformable electrical contacts to deform against. At a point, the material backing the conformable target pads also softens, enabling these target pads to conform at least in part to the deformed shape of the electrical contacts, sliding, scraping, or wiping each other in the process, forming a conductive path through a large surface area of interface formed between the two.

The softening or melting of the backing materials may progress until the two backing layers fuse, at least in part. The fusion, melting, or melding of the two backing layers provide a permanent bonding or gluing that cements the two substrates together (the metal contacts and pads have already been previously contacted and mated together, forming firm contacts and the beginnings of metal-to-metal bonds as the metal ions begin to diffuse across their interface into each other).

The deformable-conformable mating of the two electrical surfaces, and the wiping action that occurs during this electrical coupling can be controlled and programmed by implementation parameters, such as selection of materials and their geometry and construction.

For the deformable electrical contacts, construction parameters for effecting deformability of the contacts include the type of metal or alloy selected, such as copper or another conductor, in light of physical properties such as hardness, stiffness, tensile strength, malleability, and springiness at the various temperatures used during assembly, the geometrical shape of the electrical contacts, and the thickness of the contacts, since thicker contacts tend to deformable less when subjected to a force. All these factors can determine the behavior of the deformable electrical contact in the context of the selected properties of the other components, such as the physical properties of the conductive target pads and the backing layers.

Construction parameters for the conductive target pads include choice of material, such as copper, alloy, or other conductors, and geometry of the target pads, especially their thickness, since the target pads are intended to conform or mold themselves under pressure to the deformed shape assumed by the electrical contacts, when pressing against the target pads.

The one or more layers of material backing the deformable electrical contacts, and the one or more layers of material backing the conformable target pads also determine the behavior of the deformable contacts and the conformable target pads during the metal-to-metal mating that results in the making of respective electrical connections. In an implementation, the backing layers are identical, or are the same or different thicknesses of the same material or materials. In other implementations, the two backing layers may differ from each other.

In an implementation, the one or more layers of material backing the deformable electrical contacts and the one or more layers of material backing the conformable target pads remain solid, hard, and/or stiff at a first temperature that is relatively low, at which the metals of the deformable electrical contacts and the metals of the conformable target pads contact each other. At this first temperature, contact with the target pads under pressure causes the electrical contacts to deform, and contact with the electrical contacts under pressure causes the target pads to conform to the now-deformed shape of the electrical contacts.

In other implementations, one of the backing layers behind either the electrical contacts or the target pads may soften first before the other backing layer, at a selected temperature. Which backing layer softens first may depend on the properties, geometries, and relative pliancy of the electrical contacts and the target pads. Since the electrical contacts and the target pads are being pushed into each other, it may be desirable to have a softer backing layer behind the component that is expect to undergo greater formation during the deformation-conformation encounter. In an implementation, the target pads, which start out flat, may be expected to undergo greater formation (change in shape) in general during the wiping and mating processes, than the electrical contacts, which are often pre-shaped to their approximate final shape, except for a final deformation. So in one scenario the backing layer of the target pads softens first, at a first temperature during joining, and the backing layer of the electrical contacts softens at a slightly higher temperature to provide a final deformation, or even a counter-conformation, for the electrical contacts. The deformation of the electrical contacts and the conformation of the target pads may occur simultaneously, since they are being pushed into each other, so selecting the softening or melting temperatures of the two backing layers to effect the deformation-conformation can depend on the geometry, properties, and specific designs of the electrical contacts and target pads being used.

Substrate is used broadly herein to mean a surface of an electronic device or material. The surfaces being joined may be surfaces of dies, wafers, substrates, and so forth, as used in microelectronics. Substrates may be composed of a semiconductor, but may also be composed of glasses, plastics, and many other materials. "Joining" means bringing together, and can include permanent joining by an intermediate adhesive, layer, solder, or device, for example. The deformable conductive contacts and supporting underfill material described herein provide compliant die, wafer, substrate, device, and package assembly that can tolerate some variation in the conductors being joined, while providing consistent electrical paths between two surfaces or substrates.

The deformable contacts may be used in die level processes, such as die-to-die processes, die-to-wafer processes, die-to-substrate processes, intermediate structure assembly, and so forth. The deformable contacts may also be used in a wafer level processes, or during wafer-to-wafer bonding. Thus, the techniques described herein can be performed on dies or wafers, and can join dies, wafers, substrates, and the like during die level and wafer level processes. "Substrate" is used broadly herein to refer to any surface of a material or device used in the microelectronic arts.

The substrates or other surfaces to be joined may be composed of silicon or another semiconductor, III-V materials, glass, polymer, plastic, phenolic, epoxy, glass epoxy, printed circuit board, and so forth. Each surface to be joined has electrical conductors to be coupled with opposing electrical conductors on the second, opposing surface. The electrical conductors may be bonding pads of an integrated circuit, interconnects, connection points, through-silicon-vias, posts, bumps, printed circuits, grid arrays, or other conductive entities that can be conductively connected to from one surface to another surface during a join.

Figure 4:
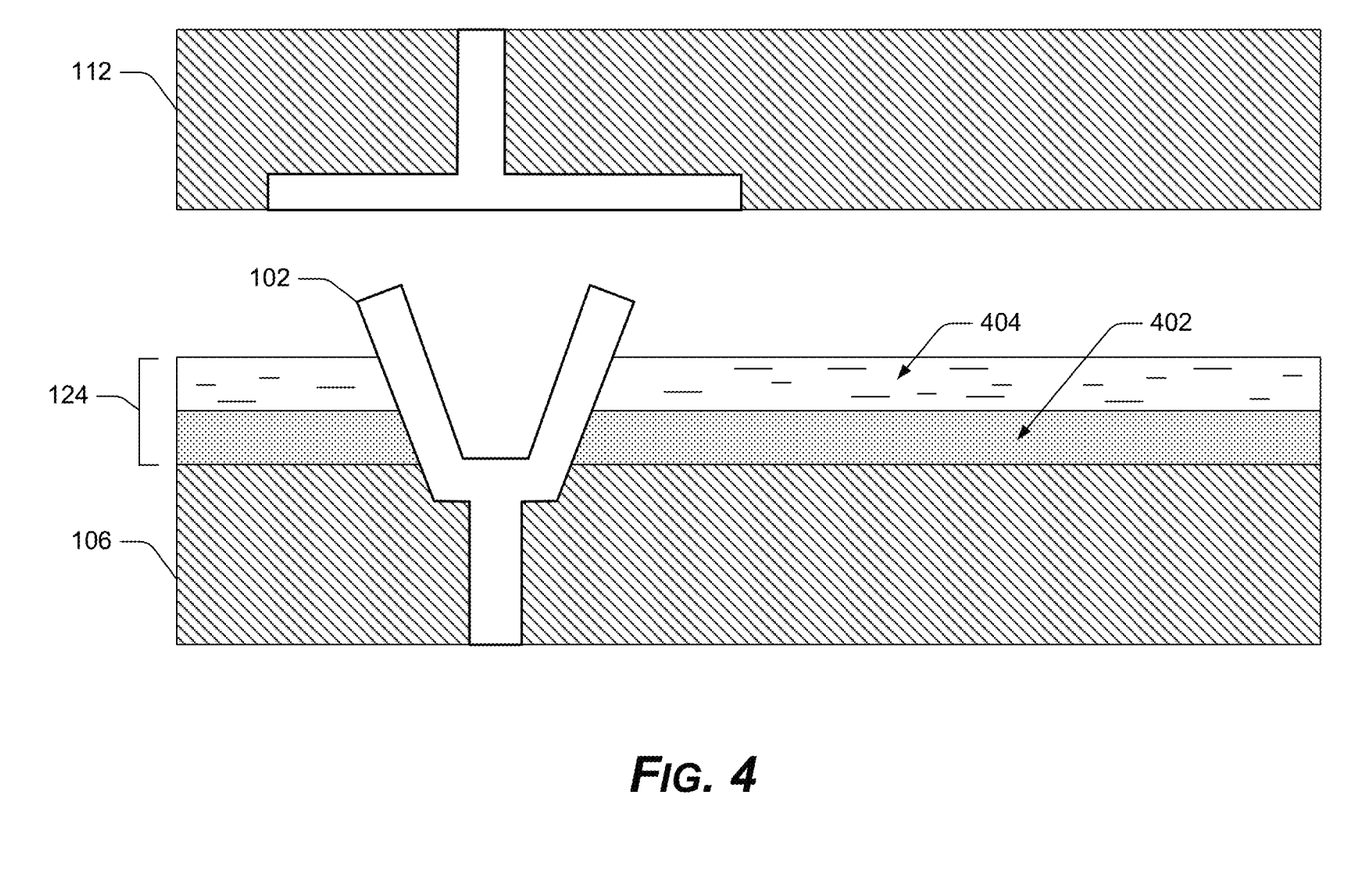
FIG. 4 is a diagram of an example underfill material having a combination of components, multiple layers, or a mixture of different materials.

As shown in FIG. 4, an example underfill material 124 (or also 122 in FIGS. 1-2) may have a combination of components, such as multiple layers, or may be a mixture of different materials. In various implementations, the at least one underfill material 124 may be a first solid underfill material 402 together with a second flowable (liquid or malleable) 404 underfill material 124. The underfill material 124 may be a dielectric, for example a single solid dielectric or a single flowable dielectric. Or, the underfill material 124 may be composed of both a solid dielectric 402 and a flowable dielectric 404. Or yet again, the example underfill material 124 may be a mixture or multi-layer combination of other solid polymers 402 and flowable polymers 404. In an implementation, the underfill material 124 is a solid or flowable thermoplastic polyimide (TPI).

In an implementation, the at least one underfill material 124 is disposed on the first substrate 106. In another implementation, the underfill material 124 may be initially disposed instead on the second substrate 112. In yet another implementation, the underfill material 124 may be disposed on both the first substrate 106 and the second substrate 112 before the first substrate 106 is joined to the second substrate 112. As introduced above, the underfill material 124 or combination of underfill materials 124 may cool or harden to permanently join the first substrate 106 to the second substrate 112 at a fixed distance 124 from each other.

Example Deformable Conductive Contacts

Figure 5:
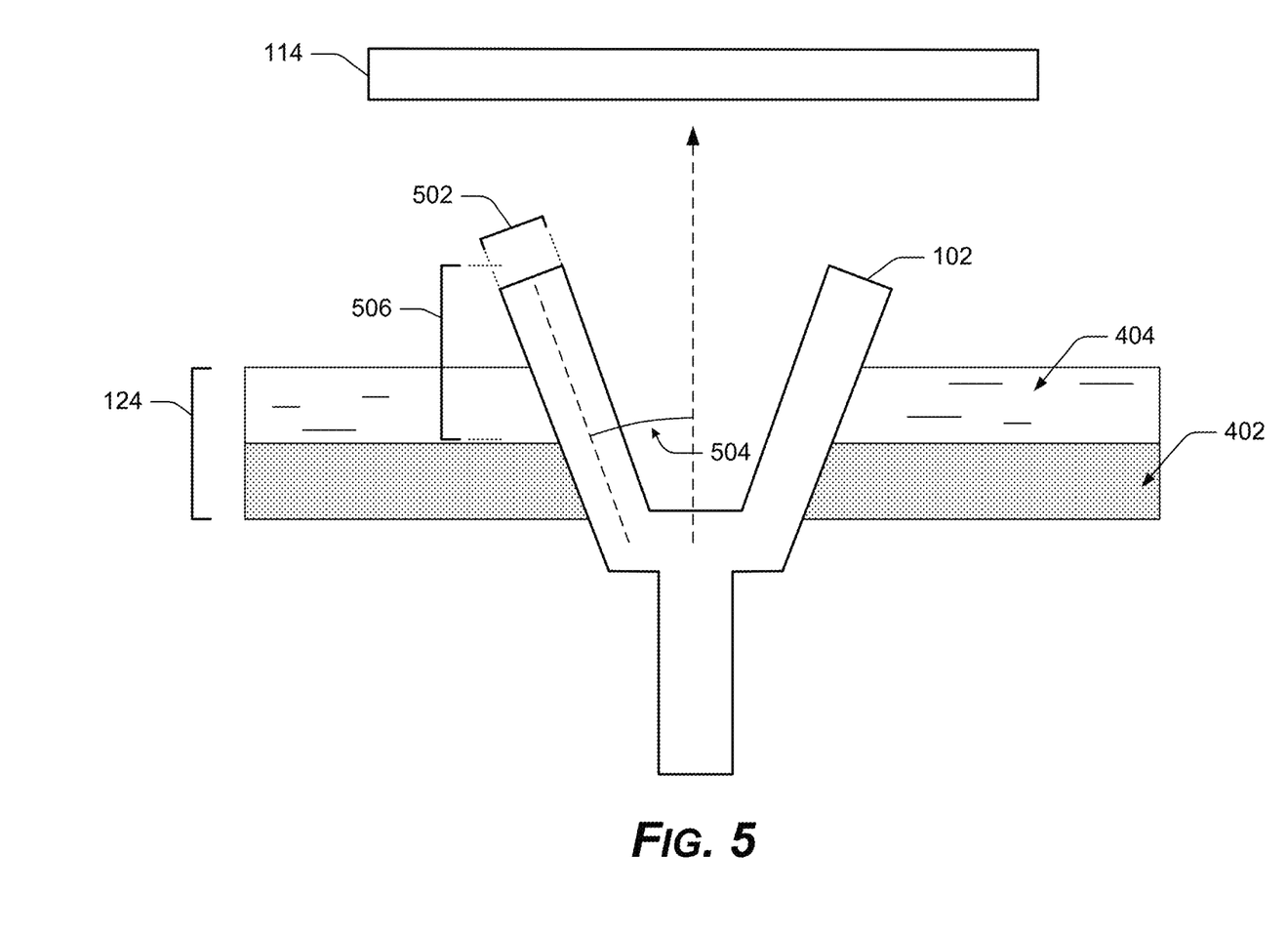
FIG. 5 is a diagram of example geometric features of an example deformable conductive contact.

FIG. 5 shows an example deformable conductive contact 102 and an opposing target conductive pad 114. The initial state of the conformable target conductive pad 114, although shown as flat, can be other various designs, such as concave, convex, ridged, or annular (ring-like). Moreover, the target conductive pad 114 may be flush with the surface of the second substrate 112, or protrude from the second substrate 112, or be recessed into the second substrate 112.

The view in FIG. 5 shows a cross-section of an implementation of the example deformable conductive contact 102 as a truncated cone. The deformable conductive contact 102, however, may be implemented in many different designs, styles, and geometries. For example, the deformable contact 102 may be implemented as a leaf of conductive material, a leaf spring, a spring, a flexible cup, a bendable finger of conductive material, a curved member, a folded member, a bent member, a 3-leaf or 4-leaf clover or cloverleaf shaped member, a v-shaped member, a v-shaped member with wings, a u-shaped member, an L-shaped member, and a y-shaped member, or the truncated cone shown in FIG. 5, for example.

Example deformable conductive contacts 102 can be made from many conductive materials used in the electronics industries. Example construction materials include copper alloys, copper, bronze, phosphor bronze, steel, titanium, silver, silver tungsten, silver tungsten carbide, copper tungsten, silver graphite, silver tungsten carbide graphite, silver molybdenum, silver nickel, copper graphite, tantalum, conductive polymers, and other conductive materials.

The deformable conductive contact 102 can be implemented in many different sizes, such as relatively large sizes for joining printed circuit boards with discrete components, the deformable conductive contact 102 measured in millimeters, down to very small contacts 102 measured in micron sizes for fine pitch circuits, leads, and traces at the finer level of assembling, stacking, and packaging wafers, chips, dies, and interconnects during die level and wafer level processes.

As shown in FIG. 5, the thickness 502 (not shown to scale) and geometry of the deformable contact 102 as well as the properties of the material used, the angle of slant 504 from the vertical direction of the joining forces, and the height 506 of the expandable part of the deformable contact 102 above solid layers 402 of the underfill material 124 can be selected to define the force needed for compliance of an individual deformable contact 102. Thus, the number of individual deformable contacts 102 that are present in the plurality of contacts 102 on a substrate 106 determines the total joining force needed for compliance of the plurality of deformable contacts 102 when joining the substrate 106 to a second substrate 112.

Example Wiping and Bonding Functions

In an implementation, the shape or design of the deformable contact 102 can interact against and across the surface of the target conductive pad 114 to provide the conductive contact or bond. For example, expansion 120 or an opening deformation of the deformable contact 102 across the pad 114, and conformation of the pad 114 to the deformed electrical contact 102, may cause a wiping motion on the target conductive pad 114 and on the electrical contact 102, enhancing the conductive coupling between the electrical contact 102 and the pad 114.

Figure 6:
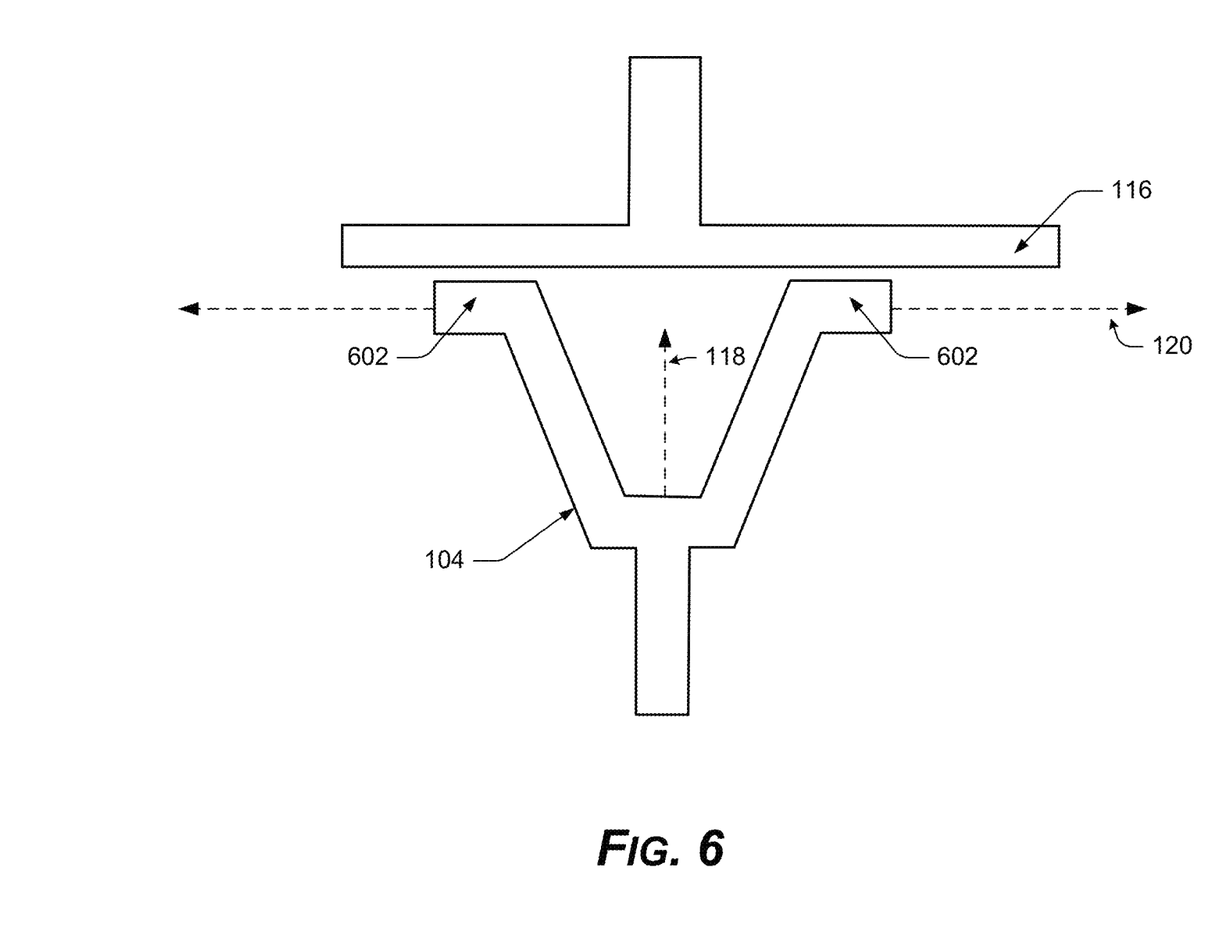
FIG. 6 is a diagram of an example deformable conductive contact with wings.

FIG. 6 shows an implementation of the deformable contact 102 that also has one or more wings 602, such as accessory appendages to facilitate electrical contact or physical performance. The wings 602 may be stabilizing members to keep the deformable contact 102 aligned during compression, and may be conductive members added to increase conductive surface area contact with the target pad 114, and may be wiping members to increase the above-mentioned wiping effect. Whether a deformable contact 102 has wings 602 or not, the deformable contact 102 may compress, morph, change shape, or deform 120 in the direction of the joining motion, and may expand 120 or spread open in one or more directions perpendicular or normal to the direction of the joining motion to perform the wiping motion of the target pad 114.

The deformable contact 102, wing 602, or other wiping member may perform a cleaning or scraping action across the target conductive pad 114, clearing a nonconductive film or oxide layer from the target pad 114 and also from itself, to make a more definite metal-to-metal electrical contact between members.

The joining pressure applied may cause the deformable contact 102 or an associated wiping member, a wing 602, for example, to cold-weld to the target pad 114 or second conductor. The metal-to-metal interface between the deformable contact 102 and the target conductive pad 114 may form a thermocompression bond or otherwise become a conductive coupling that has a metal-to-metal bond zone with no distinguishable boundary between a first metal of the deformable contact 102 (or wiping member 602), and a second metal of the target pad 114. To form such a metal diffusion bond, the two substrates 106 & 112 are brought together with a pressure and at a temperature sufficient for the conductive metal of the deformable contact 102 and the target pad 114 to meld into each other by atomic diffusion at the interface, which becomes a solid crystalline bond zone.

In an implementation, the deformable contact 102 is capable of annealing or sintering to the target conductive pad 114 or second conductor at a raised temperature, or with an application of ultrasound, or with both the raised temperature and the application of ultrasound during the joining. In an implementation, the same raised temperature and application of ultrasound may also cure or harden the underfill material 124 to complete the join between the two surfaces 106 & 112.

A geometry of the wings 602 may be selected to increase the surface area of the wings 602 and provide an increased area of surface contact between the wings 602 and the target pad 114 compared to the amount of area of surface contact that the deformable contact 102 alone would have with the target pad 114. The increased surface contact area of the wings 602 increases the conductive wingspan of the deformable contact 102 and can enable the deformable contact 102 to make contact with the target conductive pad 114 even when the deformable contact 102 is slightly misaligned with respect to the target pad 114.

Additional Implementations and Features

Figure 7:
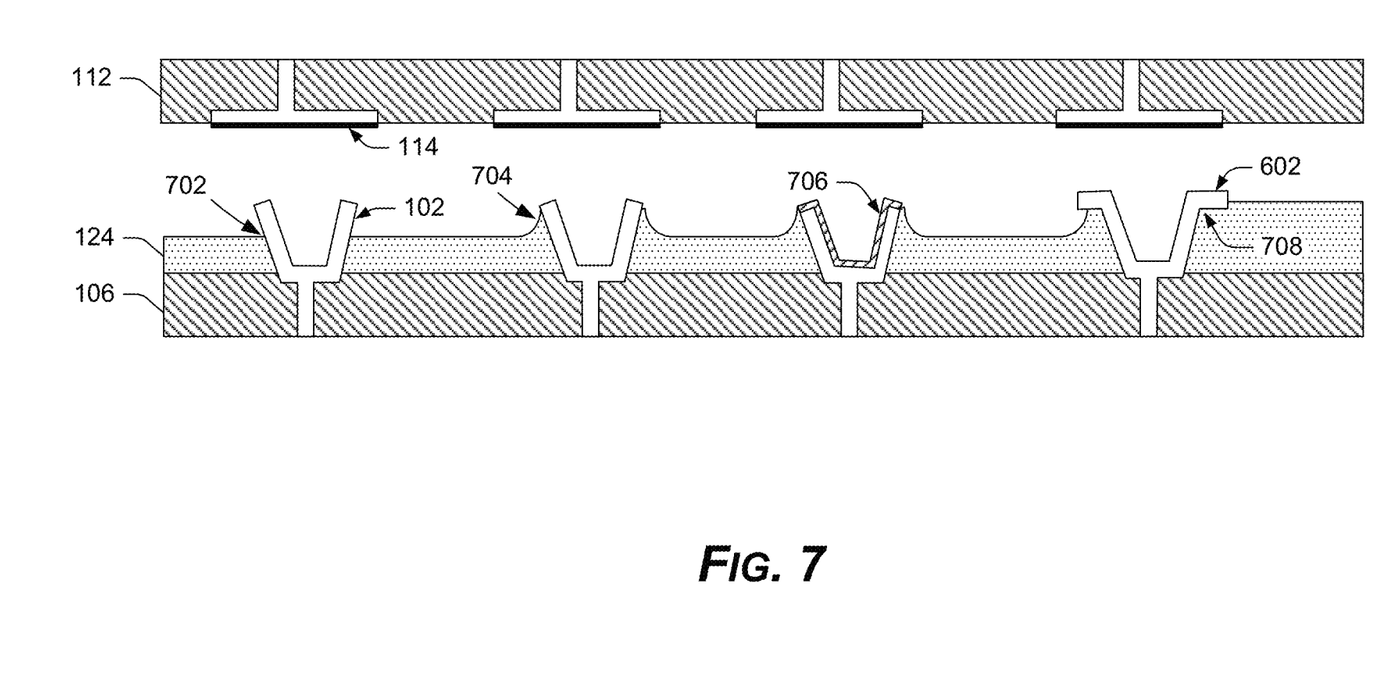
FIG. 7 is a diagram of additional implementations of the example deformable conductive contact and the example underfill material.

FIG. 7 shows additional implementations of the deformable contact 102 and the underfill material 124. The implementations shown in FIG. 7 do not necessarily occur on the same substrate 106, although two or more of the implementations can be used together on the same substrate 106 in some circumstances.

The underfill material 124 may be placed to form one or more layers up to a select level 702 of the deformable contact 102. The support provided by the underfill material 124 up to the level 702 of initial fill can determine the deformability, compressibility, spreadability, or springiness of the deformable contact 102.

A lip, collar, or slope 704 of the underfill material 124 may taper up to the contact edge of the deformable contact 102. This slope 704 of polymer or other underfill material 124 can further stiffen or strengthen the compressibility and openability of the deformable contact 102. The lip or slope 704 of underfill material 124 can increase the amount of joining pressure needed over a plurality of the deformable contacts 102 on a substrate, to compress and spread open the plurality. However, the benefit of increasing the amount of joining pressure needed, by having the lip or slope 704, is that each deformable contact 102 presses against the corresponding target pad 114 with more force when the lip or slope 704 is present. This prevents a deformation, compression, or spreading open of the deformable contact 102 from occurring with too little pressure, which might compromise the quality of the conductive coupling.

An oxidation protectant 706 may be added to the conductive contact surfaces of the deformable contact 102. The oxidation protectant 706 may depend on the constitution of the deformable contact 102, such as which metal, alloy, or other conductive material is used to make up the deformable contact 102. In an implementation, a thin layer or film of gold, platinum, or another noble or inert metal may be deposited, plated, or sputtered onto the contact surfaces of the deformable contact 102 and/or the target pads 114 to ensure a high quality of the metal-to-metal contact or thermocompression bond, and a high quality of the conductive coupling.

In an implementation, the underfill material 124, such as a dielectric or other polymer, may be initially deposited to near the top 708, the contact edge, or the wings 602 of the deformable contact 102. In this scenario, in its initial pre-joined state, the underfill material 124 has no undercut below an overhang of the wings 602, for example. In this implementation 708, the underfill material 124 may press the contact surface area of the wings 602, for example, directly into the target pad 114, supported and backed directly by the underfill material 124 with little or no allowance for the springiness or deformability of the conductive contact 102 to create coupling pressure. However, a flowable underfill material 124 may be used, at least in part, so that as the underfill material 124 complies under the forces of joining, the individual deformable contacts 102 are then able to comply individually, if some of the deformable contacts 102 are shorter or taller than others with respect to their target pads 114. In other words, the space between the first substrate 106 and the second substrate 112 may begin relatively full of the underfill material 124, but as the underfill material 124 melts or flows, each individual deformable contact 102 is able to make firm conductive contact with respective target pads 114, with some support of the underfill material 124 the entire time.

Figure 8:
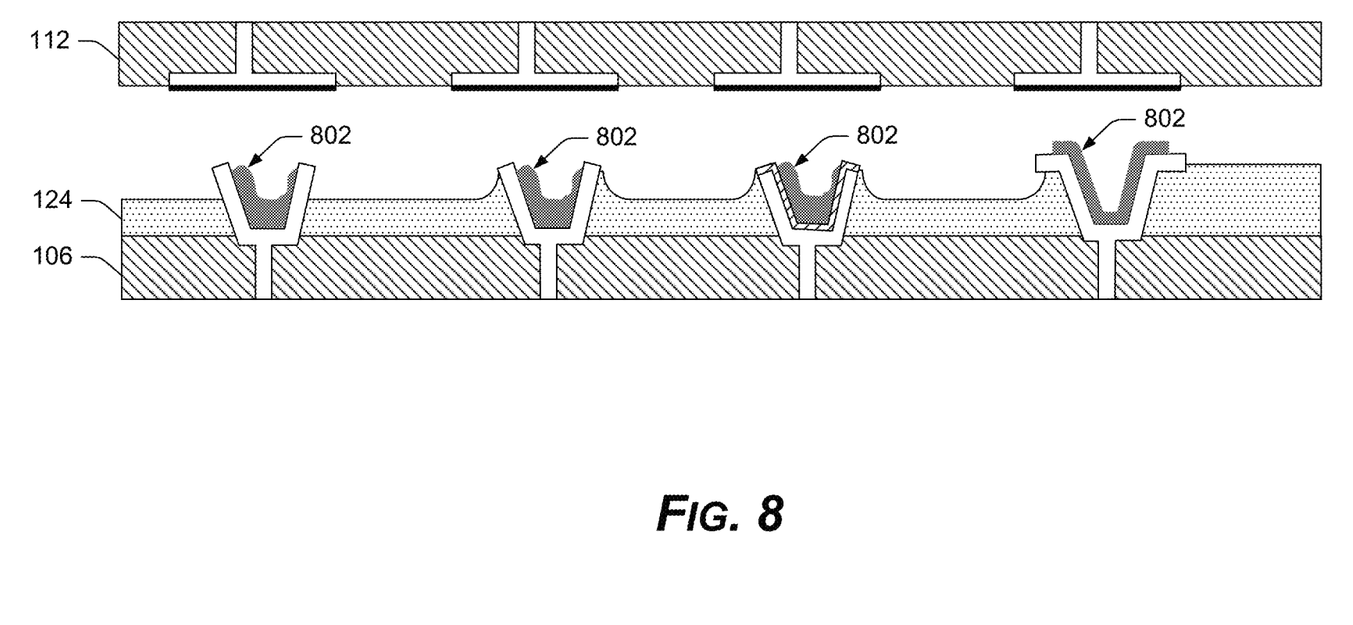
FIG. 8 is a diagram of example implementations of the example deformable conductive contact with a film or layer of solder.

FIG. 8 shows a film or layer of solder 802 or other bonding or alloying agent added to each implementation of the deformable contact 102 shown in FIG. 7. The solder 802 can be made flowable at raised temperatures, for example at temperatures in the range of 183-350° C., to secure the conductive bond in each conducting couple. The raised temperature for fusing the solder 802 may be in the same temperature range as applied to make the underfill material 124 flowable. In an implementation, upon cooling, the entire joined package cures and hardens into solidly joined substrates 106 & 112 with solidly soldered conductive couplings between the plurality of deformable contacts 102 and the plurality of conductive target pads 114.

Figure 9:
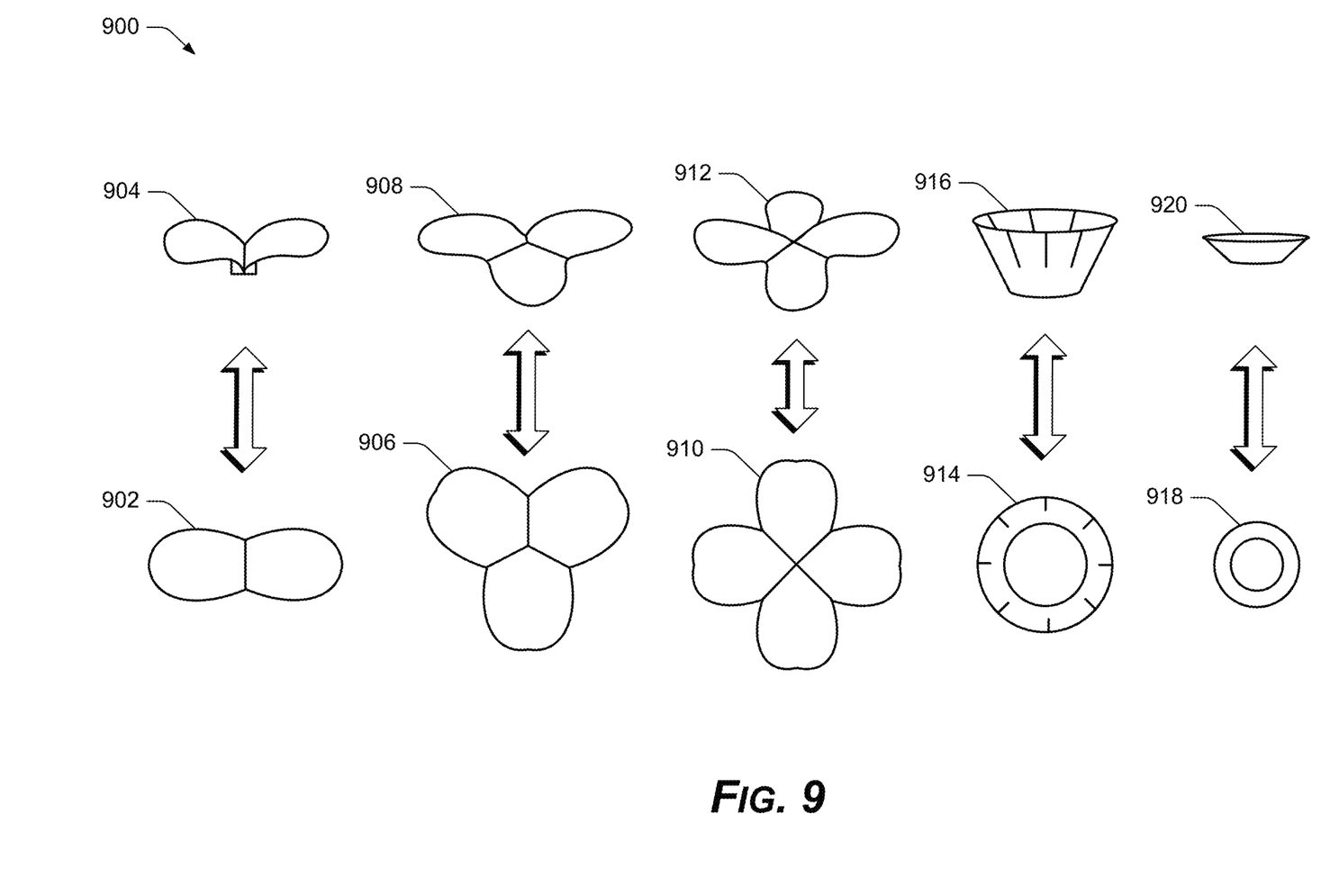
FIG. 9 is a diagram of additional examples of deformable contacts for making conductive contact between two surfaces.

FIG. 9 shows additional examples of deformable contacts 900 for making conductive contacts in electronic assembly processes. The example deformable contacts 900 are shown for the sake of illustrating that the deformable contacts 900 can have numerous different shapes. The shown set of example deformable contacts 900 is not meant to be limiting or exclusive. Dimensions of the example deformable contacts 900 shown in FIG. 9 are stylized for the sake illustrating differences in shape and function, and are not meant to limit the scale of the parts, dimensions, or features.

The shown examples of deformable contacts 900 can be implemented at different sizes. The deformable contacts 900 can be relatively large, or can be implemented on a micron scale, with some dimensions only a few microns in length, width, depth, height, or diameter.

In a top view, an example deformable contact 902 has two flexible, deformable leaves symmetrical across a line. During deformation, the two flexible leaves 904 can bend and spread apart to various degrees needed to form a compliant conductive contact with a target conductor that may be within a range of different distances from the example deformable contact 902. A plurality of the deformable contacts 902 on a single surface may each spread and open to different degrees to make respective conductive couplings.

In a top view, another example deformable contact 906 has three flexible, deformable leaves symmetrical about a point. During deformation, the three flexible leaves 908 can bend and spread apart from each other to various equal or unequal degrees needed to form a compliant conductive contact with a target conductor that may be at various distances from the example deformable contact 902, and may be at different distances from each leaf of the three-leaved deformable contact 906. A plurality of the deformable contacts 906 on a single surface may each spread and open to different degrees and to different shapes to make respective conductive couplings.

In a top view, another example deformable contact 910 has four flexible, deformable leaves symmetrical about a point, and across various lines. During deformation, the four flexible leaves 912 can bend and spread apart from each other to various equal or unequal degrees needed to form a compliant conductive contact with a target conductor that may be at various distances from the example deformable contact 910, and that may be at different distances from each leaf of the four-leaved deformable contact 910. A plurality of the deformable contacts 910 on a single surface may each spread and open to different degrees and to different shapes to make respective conductive couplings.

In a top view, another example deformable contact 914 has a truncated cone shape, with slits, divides, or serrations to provide compliant deformable members during deformation, such as compression. During deformation 916, the example deformable contact 914 can compliantly open and the members spread apart to form a compliant conductive contact with a target conductor that may be at various distances from the example deformable contact 914. A plurality of the deformable contacts 914 on a single surface may each spread and open to different degrees to make respective conductive couplings.

In a top view, another example deformable contact 918 has a shallow dish or cup shape, symmetrical about a center point. During deformation 920, the dish or cup shape of the example deformable contact 918 can open and enlarge to various degrees needed to form a compliant conductive contact with a target conductor that may be within a range of different distances from the example deformable contact 918. A plurality of the deformable contacts 918 on a single surface may each spread and open to different degrees to make respective conductive couplings.

Numerous other shapes and dimensions of the example deformable contacts 900 can be implemented within the scope of the described subject matter. For example, a given example deformable contact 900 may also have extra wings or appendages, as described further above.

Example Methods

Figure 10:
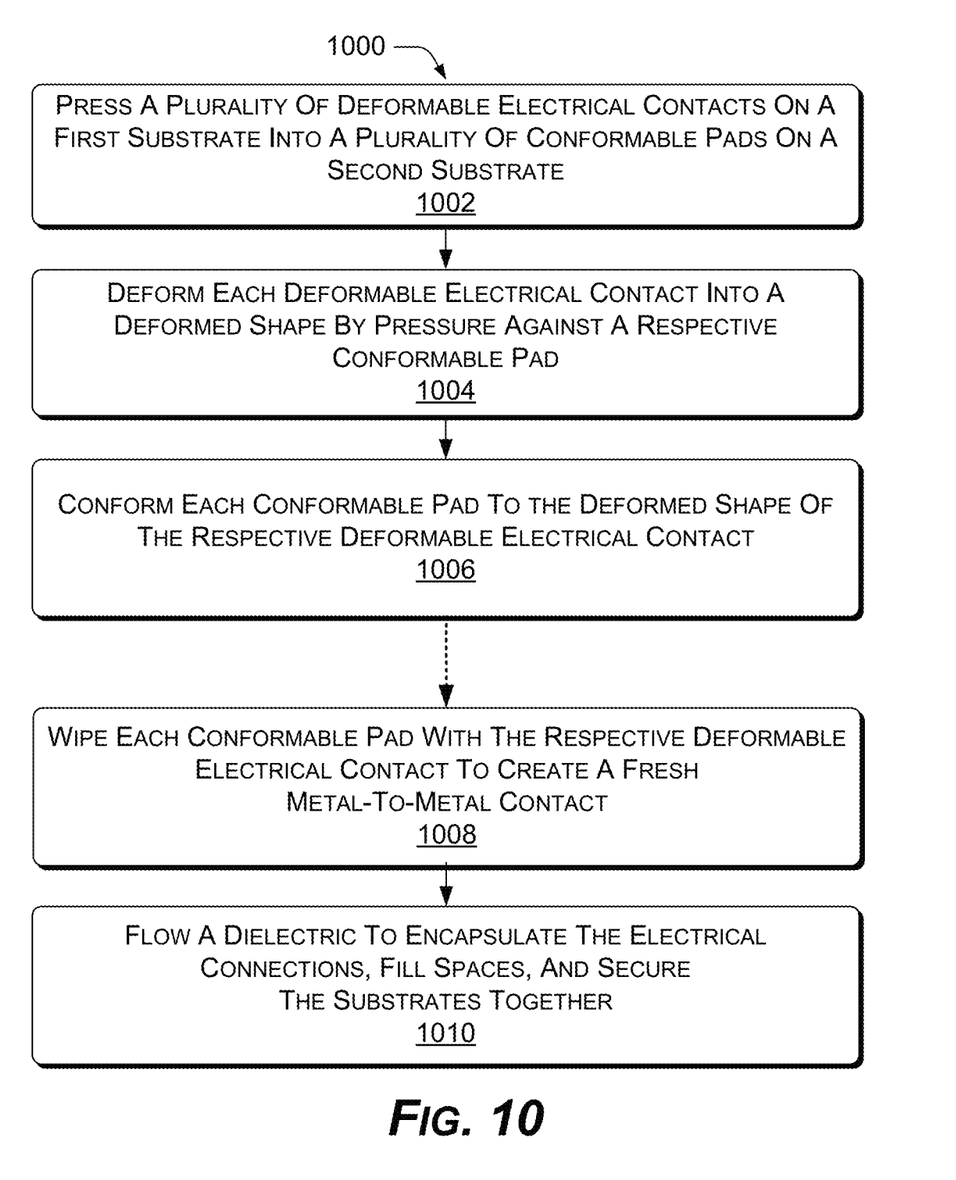
FIG. 10 is a flow diagram of an example method of electronic assembly with deformable conductive contacts and conformable target pads.

FIG. 10 shows an example method 1000 of making conductive connections across two surfaces with deformable electrical contacts and conformable target pads. In the flow diagram of FIG. 10, operations of the example method 1000 are shown in individual blocks.

At block 1002, a plurality of deformable electrical contacts on a first surface are pressed into a plurality of conformable pads on a second surface to make respective electrical connections between the first surface and the second surface.

At block 1004, each deformable electrical contact is deformed or morphed into a deformed shape by pressure against a respective conformable pad.

At block 1006, each respective conformable pad, in turn, conforms into the deformed shape of the deformable electrical contact, making a conductive contact of relatively large surface area.

Further, at block 1008, the deforming at block 1004 may further include wiping each respective conformable pad with the deformable electrical contact to create a fresh metal-to-metal contact between the respective conformable pad and the deformable electrical contact.

And further, at block 1010, the example method may include melting, softening, and/or flowing a dielectric that is backing at least the plurality of deformable electrical contacts or the plurality of conformable pads, in order to encapsulate the electrical connections between the plurality of deformable electrical contacts and the plurality of conformable pads, to flow into spaces, and to secure the first surface to the second surface.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A system, comprising:
a plurality of contacts on a first substrate;
each contact comprising a v-shaped or a cup-shaped profile;
a plurality of flat pads on a second substrate, each flat pad of the second substrate facing an open end of the v-shaped or cup-shaped profile of a corresponding contact on the first substrate;
a compressible material underlying the plurality of flat pads;
each contact expanded to an opened v-shaped profile or an opened cup-shaped profile when the first substrate is joined to the second substrate; and
each flat pad conformed to the open v-shape profile or the open cup-shape profile of the corresponding contact to make a conformed pad when the first substrate is joined to the second substrate, each contact and corresponding conformed pad making a metal-to-metal contact bond between metals of the contact and its corresponding conformed pad.

2. The system of claim 1, further comprising a wiping surface on each contact and flat pad, wherein the wiping surface moves to create a metal-to-metal interface between the contact and the conformed pad while removing or displacing an oxide layer, a patina, a residue, or an impurity when each contact and each corresponding flat pad slide against each other at the wiping surface during conductive coupling.

3. The system of claim 1, wherein the compressible material comprises at least one underfill material between the first substrate and the second substrate to deform each contact against each corresponding flat pad and to determine a closest proximity of the first substrate to the second substrate.

4. The system of claim 3, wherein the at least one underfill material is selected from the group consisting of a first solid underfill material and a second flowable underfill material, a flowable dielectric, a solid dielectric, both a solid dielectric and a flowable dielectric, a mixture of solid and flowable polymers, and a thermoplastic polyimide.

5. The system of claim 3, wherein the at least one underfill material is disposed on the first substrate, on the second substrate, or on both the first substrate and the second substrate before the first substrate is joined to the second substrate;
wherein the at least one underfill material flows at a raised temperature to conform the plurality of flat pads to the plurality of contacts; and
wherein the at least one underfill material cools or hardens to permanently join the first substrate to the second substrate.

6. The system of claim 3, further comprising at least a first layer of an underfill backing the plurality of contacts and a second layer of an underfill backing the plurality of flat pads;
wherein the first layer of underfill and the second layer of underfill have a hardness suitable for pressing the contacts into the flat pads and for deforming the flat pads into the conformed pads at a joining temperature for the contacts and the conformed pads; and
wherein the first layer of underfill and the second layer of underfill have a softening temperature or a fusion temperature higher than the joining temperature for encapsulating the coupled contacts and conformed pads, and for gluing the first layer of underfill and the second layer of underfill to each other, and for permanently securing the first substrate to the second substrate.

7. The system of claim 6, further comprising a first material for the first layer of underfill and a second material or a same material for the second layer of underfill, the first material or the second material having a flowability at the softening temperature for filling holes, gaps, and spaces in the first layer of underfill and the second layer of underfill and around coupled contacts and conformed pads to absorb or compensate for z-thickness variations of the first and second substrates and the first and second underfill layers.

8. The system of claim 1, wherein the v-shaped or the cup-shaped profile of each contact comprises a degree of deformability to provide compliance and conductive contact for variations in proximity between each contact of the plurality of contacts and each corresponding flat or conformed pad, and each flat or conformed pad comprises a geometry capable of conforming to the deformability of the corresponding contact.

9. The system of claim 1, wherein each conformed pad makes a metal-to-metal contact bond over an entire surface area of the corresponding contact facing the conformed pad, when the corresponding contact is expanded to the opened v-shaped profile or the opened cup-shaped profile.

10. An apparatus, comprising:
a deformable electrical contact capable of changing to a deformed shape to make a conductive coupling between a first conductor of a first surface and a second conductor of a second surface when the first surface is brought into proximity to the second surface;
the deformable electrical contact comprising a v-shaped or a cup-shaped cross-section;
a wiping surface of the deformable electrical contact configured to move across the second conductor when making the conductive coupling;
the deformable electrical contact opening into an expanded v-shaped cross-section or an expanded cup-shaped cross-section when pressed against the second conductor; and
a pad of the second conductor conforming to the expanded v-shaped cross-section or the expanded cup-shaped cross-section of the deformable electrical contact of the first conductor to make a conformed pad and to make the conductive coupling between the first conductor and the second conductor.

11. The apparatus of claim 10, further comprising one or more layers of at least one underfill material to fill at least a part of a space between the first surface and the second surface;
wherein the one of more layers of at least one underfill material further comprise a polymer material or dielectric to provide a supporting force to the wiping surface when moving across the second conductor; and
wherein the polymer material or the dielectric determines a degree of maximum movement of the wiping surface.

12. The apparatus of claim 10, wherein at least a layer of the one of more layers of the at least one underfill material is flowable at a temperature above a joining temperature at which the deformable electrical contact and the conformed pad electrically couple.

13. The apparatus of claim 10, wherein the deformable electrical contact has a geometry to deform in a direction of the joining and expands or spreads open in one or more directions perpendicular to the direction of the joining to perform a wiping of the pad.

14. The apparatus of claim 10, wherein the wiping surface is configured to clear nonconductive films on the deformable electrical contact and on the pad during a wiping action while making the conductive coupling.

15. The apparatus of claim 10, wherein a pressure between the first surface and the second surface during the joining causes the deformable electrical contact to weld to the conformed pad, wherein the weld between the deformable electrical contact and the conformed pad of the second conductor comprises a thermocompression bond, a diffusion bond, or a metal-to-metal bond.

16. The apparatus of claim 10, wherein the deformable electrical contact is capable of annealing or sintering to the conformed pad of the second conductor at a raised temperature or upon an application of ultrasound, or both at the raised temperature and upon the application of ultrasound, during the joining.

17. The apparatus of claim 10, further comprising at least a first layer of an underfill backing a plurality of the deformable electrical contacts and a second layer of an underfill backing a plurality of the pads;
wherein the first layer of underfill and the second layer of underfill have a hardness suitable for deforming the deformable electrical contacts into the pads and for conforming the pads into a deformed shape of the deformable electrical contacts and the conformed pads at a joining temperature of the deformable electrical contacts and the conformed pads; and
wherein the first layer of underfill and the second layer of underfill have a softening temperature or a fusion temperature higher than the joining temperature for encapsulating the coupled deformable electrical contacts and the conformed pads, and for gluing the first layer of underfill and the second layer of underfill to each other to permanently secure the first surface to the second surface.

18. The apparatus of claim 10, wherein each conformed pad makes a metal-to-metal contact bond over an entire surface area of the corresponding deformable electrical contact facing the conformed pad, when the corresponding deformable electrical contact is expanded to the opened v-shaped cross-section or the opened cup-shaped cross-section.

* * * * *